United States Patent
Fujinami et al.

Patent Number: 6,103,321
Date of Patent: Aug. 15, 2000

[54] METHOD OF MANUFACTURING AN ULTRAVIOLET RESISTANT OBJECT

[75] Inventors: Yasushi Fujinami, Takatsuki; Akinori Ebe, Kyoto; Osamu Imai, Otsu; Kiyoshi Ogata, Yawata, all of Japan

[73] Assignee: Nissin Electric Co., Ltd., Kyoto, Japan

[21] Appl. No.: 09/212,381

[22] Filed: Dec. 16, 1998

[30] Foreign Application Priority Data

Dec. 17, 1997 [JP] Japan .................................. 9-347666
Dec. 14, 1998 [JP] Japan ................................ 10-354051

[51] Int. Cl.$^7$ ........................................................ B05D 3/00
[52] U.S. Cl. ................. 427/553; 427/126.3; 427/255.31; 427/255.36; 427/529; 427/162
[58] Field of Search ................................. 427/553, 126.3, 427/255.31, 255.36, 529, 162; 204/192.15

[56] References Cited

FOREIGN PATENT DOCUMENTS

| | | |
|---|---|---|
| 2-122925 | 5/1990 | Japan . |
| 5-179034 | 7/1993 | Japan . |
| 5-209072 | 8/1993 | Japan . |
| 8-98870 | 4/1996 | Japan . |
| 9-142539 | 6/1997 | Japan . |
| 10-316780 | 2/1998 | Japan . |

*Primary Examiner*—Roy V. King
*Attorney, Agent, or Firm*—Arent Fox Kintner Plotkin & Kahn, PLLC

[57] ABSTRACT

A method of manufacturing an ultraviolet resistant object, wherein the object has at least a portion made of a polymer material, and is provided with an ultraviolet shielding film covering at least a portion of a surface of the portion made of the polymer material, including the steps of forming the ultraviolet shielding film by vapor deposition over the surface of the portion to be covered with the film; and irradiating, prior to the formation of the ultraviolet shielding film or in an initial stage of the film forming step, the film formation surface with ions with an energy in a range from 0.05 keV to 2 keV to attain the total irradiation rate in a range from $1 \times 10^{13}$ ions/cm$^2$ to $5 \times 10^{17}$ ions/cm$^2$.

19 Claims, 1 Drawing Sheet

METHOD OF MANUFACTURING AN ULTRAVIOLET RESISTANT OBJECT

This invention is based on Patent applications Nos. 9-347666 Pat. and 10-354051 Pat. filed in Japan, the contents of which are hereby incorporated by reference.

BACKGROUND OF THE INVENTION

1. Field of the Invention

The present invention relates to an ultraviolet resistant object or article having at least a portion made of a polymer material and having a resistance to ultraviolet light, as well as a method of manufacturing the same.

2. Description of the Background Art

Polymer materials such as resin and rubber have been used in various fields owing to their light weights and high shock resistances. However, the polymer materials generally have low resistance against ultraviolet light, and are liable to be deteriorated when irradiated with ultraviolet light. Accordingly, significant deterioration of a portion made of the polymer material is liable to occur in such a case that the polymer material portion is present in a device, instrument or the like, which is used near an ultraviolet lamp in a hospital, laboratory or the like, or in an outdoor position or the like exposed to sunlight. In particular, objects for a medical use are usually kept in environments where they are irradiated with ultraviolet light in many cases, although they are usually sterilized by a high-pressure steam, a gas or the like before use.

In order to suppress deterioration of the polymer material due to exposure to ultraviolet light, various methods have been employed. For example, an ultraviolet absorbent is kneaded into the polymer material, or a coating material containing an ultraviolet absorbent is applied to the surface of the portion made of polymer material.

For example, Japanese Laid-Open Patent Publication No. 8-98870 (98870/1996) has disclosed that an ultraviolet shielding container for a medical use, which is made of a thermoplastic resin additionally containing 0.01–1%, by weight, of titanium oxide having an average particle diameter of 10–40 $\mu$m, can prevent change in quality of contents in the container due to ultraviolet irradiation while maintaining a transparency of the resin.

According to the method in which the ultraviolet absorbent is kneaded into the polymer material, however, addition of the ultraviolet absorbent may change original characteristics such as a mechanical strength and a thermal resistance of the polymer material. In some cases, this method cannot be applied to medical objects and others without difficulty because the ultraviolet absorbent may impair safety of human bodies.

According to the method in which a coating material including the ultraviolet absorbent is applied onto the object, the original characteristics of the polymer material are hardly affected in many cases. However, increase in amount of the ultraviolet absorbent lowers the adhesivity of the coating material to the polymer material so that the amount or content of ultraviolet absorbent is restricted. Accordingly, the ultraviolet shielding performance cannot be sufficiently achieved. Further, the coating material inherently has a low adhesivity to the polymer material, and therefore a possibility of peeling off increases over time. For these reasons, it is difficult to keep an intended ultraviolet absorbing performance for a long term. Moreover, even an object employing the coating material may not be applied to a medical object or the like, depending on the safety achieved by the ultraviolet absorbent.

SUMMARY OF THE INVENTION

Accordingly, it is an object of the invention to provide an object having at least a portion made of a polymer material and, in particular, an ultraviolet resistant object, in which the polymer material can maintain its original characteristics, and deterioration of the polymer material due to ultraviolet light is sufficiently suppressed.

Another object of the invention is to provide an object having at least a portion made of a polymer material and, in particular, an ultraviolet resistant object, in which the polymer material can maintain its original characteristics, deterioration of the polymer material due to ultraviolet light is sufficiently suppressed, and safety of human bodies is ensured.

Still another object of the invention is to provide an object having at least a portion made of a polymer material and, in particular, an ultraviolet resistant object, in which the polymer material can maintain its original characteristics, and deterioration of the polymer material due to ultraviolet light is sufficiently suppressed for a long term.

Yet another object of the invention is to provide an object having at least a portion made of a polymer material and, in particular, an ultraviolet resistant object, in which the polymer material can maintain its original characteristics, deterioration of the polymer material due to ultraviolet light is sufficiently suppressed for a long term, and safety of human bodies is ensured.

Further, it is an object of the invention to provide a method of manufacturing an ultraviolet resistant object having at least a portion made of a polymer material and, in particular, a method of manufacturing an ultraviolet resistant object, in which the polymer material can maintain its original characteristics, and deterioration of the polymer material due to ultraviolet light is sufficiently suppressed for a long term.

It is also an object of the invention to provide a method of manufacturing an ultraviolet resistant object having at least a portion made of a polymer material and, in particular, a method of manufacturing an ultraviolet resistant object, in which the polymer material can maintain its original characteristics, deterioration of the polymer material due to ultraviolet light is sufficiently suppressed for a long term, and safety of human bodies is ensured.

The invention provides an ultraviolet resistant object having at least a portion made of a polymer material, and provided with an ultraviolet shielding film made of a substance having in itself an ultraviolet shielding property and formed over at least a portion of a surface of the portion made of the polymer material.

According to this ultraviolet resistant object, the polymer material portion coated with the film, which is made of the substance having in itself the ultraviolet shielding property and thus has the ultraviolet shielding property, is sufficiently prevented from deterioration, which may be caused by ultraviolet light. Also, the substance having the ultraviolet light shielding performance forms the film over the object to be coated with the film so that the original characteristics of the polymer material portion of the object are never or hardly impaired.

In contrast to a coating material applied to the surface of the polymer material portion, the ultraviolet shielding film made of the substance having in itself the ultraviolet shielding property can be formed by physical or chemical vapor deposition to have a good adhesivity to the surface of the polymer material portion. Thereby, it is possible to suppress sufficiently the deterioration of the polymer material due to the ultraviolet light for a long term.

The object to be coated with the ultraviolet shielding film may be a part of an object or article, a portion of an object or article, or an object or article itself.

Therefore, the ultraviolet resistant object according to the invention may be a part of an object or article, a portion of an object or article, or an object or article itself.

The invention also provides the ultraviolet resistant object, in which the ultraviolet shielding film is a safe film for human bodies.

Further, the invention provides the ultraviolet resistant object, in which the polymer material is a safe material for human bodies.

Moreover, the invention provides a method of manufacturing an ultraviolet resistant object having at least a portion made of a polymer material and being provided with an ultraviolet shielding film made of a substance having in itself an ultraviolet shielding property and formed over at least a portion of a surface of the portion made of the polymer material, wherein ion irradiation and vapor deposition for forming the ultraviolet shielding film are effected on the surface of the polymer material portion to be covered with the ultraviolet shielding film.

Additional use of the ion irradiation can improve the adhesivity of the ultraviolet shielding film, and deterioration of the polymer material covered with the film can be suppressed for a long term.

In the method of manufacturing the ultraviolet resistant object described above, the invention further provides the method which can form the ultraviolet shielding film ensuring safety of human bodies.

In the method of manufacturing the ultraviolet resistant object described above, the invention further provides the method which employs the polymer material ensuring safety of human bodies.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
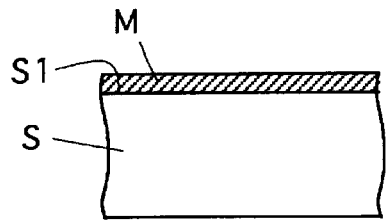
FIGS. 1(A), 1(B) and 1(C) are fragmentary cross sections of ultraviolet resistant objects of different embodiments of the invention, respectively.

An ultraviolet resistant object of an embodiment of the invention has at least a portion made of a polymer material, and is provided with an ultraviolet shielding film made of a substance having in itself an ultraviolet shielding property and formed over at least a portion of a surface of the portion made of the polymer material.

The ultraviolet shielding film may be made of titanium oxide or tantalum oxide, e.g., tantalum pentoxide, although not restricted to them. The titanium oxide and tantalum oxide, e.g., tantalum pentoxide have a high ultraviolet shielding performance in themselves, and can ensure a safety of human bodies. Therefore, the ultraviolet resistant object has a safety.

Since a transparent film can be formed of the titanium oxide and tantalum oxide, e.g., tantalum pentoxide, the object coated with the transparent film of titanium oxide or tantalum oxide can maintain the original appearance. This allows application of the film to products relating to displays.

The film thickness of the ultraviolet shielding film depends on a specific kind of the polymer material, a use environment of the object and others, but is determined not to exceed excessively the minimum thickness which can sufficiently suppress the deterioration of the polymer material portion of the object due to ultraviolet irradiation. An excessively large thickness lowers the film adhesivity. For example, the film made of titanium oxide or tantalum oxide may have a thickness in a range from about 20 nm to about 2000 nm.

If the ultraviolet shielding film is made of the titanium oxide or tantalum oxide, an intermediate film made of titanium or tantalum may be formed between the ultraviolet shielding film and the polymer material portion of the object for improving the adhesivity of the titanium oxide or tantalum oxide film.

The specific kind of the polymer material is not particularly restricted, and polyethylene, polypropylene, polyester, polyvinyl chloride, polyurethane, polystyrene, fluorine-contained resine (in other words, fluororesin or fluorocarbon resin) (e.g., PTFE: polytetrafluorethylene, PFEP: tetrafluorethylene-hexafluoropropylene copolmer, PETFE: ethylene-tetrafluorethylene copolymer, PFA: tetrafluorethylene-perfluoroalkylvinyl ether copolymer, PECTFE: ethylene-chlorotrifluoroethylene copolymer, PCTFE: polychloro-trifluoroethylene, PVDF: polyvinylidene fluoride or PVF: polyvinyl fluoride), silicone resin or the like may be employed.

For a medical use or the like, it is preferable to use fluorine-contained resine or silicone resin for the ultraviolet resistant object in view of safety. By forming the titanium oxide film or tantalum oxide film over the portion made of such resin, the film formation object can maintain the safety as a whole.

In the ultraviolet resistant object, the ultraviolet shielding film may be formed over at least a portion of the polymer material portion of a medical object. This allows sterilization of the medical object by irradiation with ultraviolet light. Specifically, the medical objects may be tubes such a catheter, artificial teeth, contact lenses, artificial blood vessels, various kinds of implants and others.

The following two methods (1) and (2) are embodiments of the method of manufacturing the ultraviolet resistant object according to the invention.

(1) The method of manufacturing the ultraviolet resistant object, wherein the object has at least a portion made of a polymer material, and is provided with an ultraviolet shielding film made of a substance having in itself an ultraviolet shielding property and covering at least a portion of a surface of the portion made of the polymer material, including the steps of irradiating the surface of the portion made of the polymer material to be covered with the ultraviolet shielding film with ions with an ion emitting energy in a range from 0.05 keV to 2 keV and a rate in a range from $1 \times 10^{13}$ ions/cm$^2$ to $5 \times 10^{17}$ ions/cm$^2$ (in other words, with an ion emitting energy in a range from 0.05 keV to 2 keV to attain the total irradiation rate or amount in a range from $1 \times 10^{13}$ ions/cm$^2$ to $5 \times 10^{17}$ ions/cm$^2$); and forming the ultraviolet shielding film by vapor deposition over the surface of the portion made of the polymer material and irradiated with the ions after the ion irradiation.

(2) The method of manufacturing the ultraviolet resistant object, wherein the object has at least a portion made of a polymer material, and is provided with an ultraviolet shielding film made of a substance having in itself an ultraviolet shielding property and covering at least a portion of a surface of the portion made of the polymer material, including the steps of forming the ultraviolet shielding film by vapor deposition over said surface of the portion made of the polymer material to be covered with the ultraviolet shielding film; and irradiating, in an initial stage of the film forming step, the film formation surface with ions with an energy in a range from 0.05 keV to 2 keV and a rate in a range from $1 \times 10^{13}$ ions/cm$^2$ to $5 \times 10^{17}$ ions/cm$^2$ (in other words, with an ion emitting energy in a range from 0.05 keV to 2 keV to attain the total irradiation rate or amount in a range from $1 \times 10^{13}$ ions/cm$^2$ to $5 \times 10^{17}$ ions/cm$^2$).

In the above method (2), the ion irradiation in the initial stage of the film formation may be performed before the thickness of the film exceeds 10 nm.

In the above method (2), the film formation surface, i.e., the surface to be coated with the film of the object may be irradiated with ions prior to the film formation, and subsequently the irradiation with ions may be performed in the initial stage of the film formation (e.g., before the film thickness exceeds 10 nm) provided that the total rate of ion irradiation is in a range not exceeding $5 \times 10^{17}$ ions/cm$^2$.

In any of the methods of manufacturing the ultraviolet resistant objects described above, the specific method of the vapor deposition of the ultraviolet shielding film is not particularly restricted, and vacuum evaporation, sputtering, ion plating (reactive ion plating, arc ion plating and others), various CVD (chemical vapor deposition) methods and others may be employed, provided that the method does not cause an unignorable damage such as a thermal damage to the polymer material portion of the object.

Any one of the above methods may form the film in an atmosphere of oxygen for controlling a film composition.

Any one of the above methods can manufacture the ultraviolet resistant object, in which characteristics of the polymer material is not impaired and deterioration due to the ultraviolet irradiation is sufficiently suppressed, because the portion made of the polymer material in the film formation object is coated by the film having an ultraviolet shielding performance.

According to the above method (1), the surface of the object to be coated with the film is irradiated with ions to activate the surface prior to formation of the ultraviolet shielding film. This improves the adhesivity between the surface and the film which will be formed later. Accordingly, the ultraviolet shielding film can have a high resistance to peeling or separation, the method can provide the ultraviolet resistant object, in which deterioration of the polymer material portion coated with the film is suppressed for a long term.

According to the method of the above item (2) and others, the surface of the object to be coated with the film is irradiated with ions while the film is being formed and, in particular, in an initial stage during the formation of the ultraviolet shielding film. Thereby, the surface of the object is activated, and a mixture layer including the materials of the film and the surface portion is formed in the boundary portion between them so that the film adhesivity is improved. Accordingly, separation of the ultraviolet shielding film is suppressed so that the method can provide the ultraviolet resistant object, in which deterioration of the polymer material portion coated with the film is suppressed for a long term.

The polymer material has a relatively low thermal resistance. However, any one of the foregoing methods of manufacturing the ultraviolet resistant objects is executed with the ion emission energy not exceeding 2 keV and the irradiation rate not exceeding $5 \times 10^{17}$ ions/cm$^2$. Accordingly, the ion irradiation does not heat the object to an extent causing an unignorable damage and/or deterioration of its characteristics.

In any one of the foregoing methods of manufacturing the ultraviolet resistant objects, the ion emission energy is in a range from 0.05 keV to 2 keV, and the ion irradiation rate is in a range from $1 \times 10^{13}$ ions/cm$^2$ to $5 \times 10^{17}$ ions/cm$^2$ for the following reasons. If the ion emission energy were lower than 0.05 keV, or the ion irradiation rate were lower than $1 \times 10^{13}$ ions/cm$^2$, activation of the film formation surface of the object as well as formation of the foregoing mixture layer would not be achieved sufficiently. If the ion emission energy were higher than 2 keV, or the ion irradiation rate were higher than $5 \times 10^{17}$ ions/cm$^2$, thermal and other damages would be caused on the surface irradiated with ions, as already described.

In any one of the foregoing methods of manufacturing the ultraviolet resistant objects, the ions to be emitted may be ions of an inert gas such as neon, argon, krypton or xenon regardless of the kind of the film. If the titanium oxide film or tantalum oxide film (e.g., tantalum pentoxide film) is to be formed, other kinds of ions such as oxygen gas ions, or ions of mixture of the oxygen gas ions and inert gas ions may also be used.

In any one of the foregoing methods of manufacturing the ultraviolet resistant objects, the ultraviolet shielding film may be a titanium oxide film or a tantalum oxide film(e.g., tantalum pentoxide film), although not restricted thereto.

The thickness of the ultraviolet shielding film may be equal or similar to that already described in connection with the ultraviolet resistant object.

If the ultraviolet shielding film is a titanium oxide film or a tantalum oxide film, an intermediate film which is a titanium film or a tantalum film may be formed between the titanium oxide film or tantalum oxide film and the polymer material portion of the object.

The kind of the polymer material may be similar to those already described in connection with the ultraviolet resistant object.

If the ultraviolet resistant object is, for example, a medical object or article, it is particularly preferable to use fluororesin or silicone resin in view of safety. By forming the titanium oxide film or tantalum oxide film, e.g., tantalum pentoxide film over the portion made of such resin, the film formation object can maintain the safety of human bodies as a whole.

The objects manufactured by the method may be tubes such a catheter, artificial teeth, contact lenses, artificial blood vessels, various kinds of implants and others.

Figure 1B:
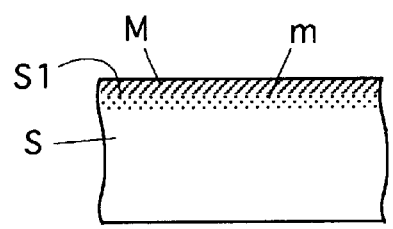
Figure 1C:
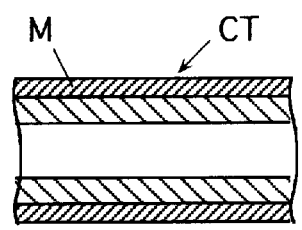

FIGS. 1(A), 1(B) and 1(C) are fragmentary cross sections showing, by way of example, ultraviolet resistant objects.

The ultraviolet resistant object shown in FIG. 1(A) is formed of a film formation object S, i.e., object S to be coated with a ultraviolet shielding film, which is entirely made of resin and is, specifically, wrapping sheet in this embodiment, and an ultraviolet shielding film M formed over an outer surface S1 of the film formation object S. According to the ultraviolet resistant object, the film M having an ultraviolet shielding performance is formed over the outer surface S1 so that deterioration of the resin due to irradiation of the outer surface S1 with ultraviolet light is suppressed. Since the substance having the ultraviolet shielding performance is applied, as the film M, to the outer side of the film formation object S, the characteristics of the resin of the film formation object S is not impaired or is hardly impaired.

The ultraviolet resistant object shown in FIG. 1(B) is formed of the film formation object S entirely made of resin, the ultraviolet shielding film M covering the outer surface S1 of the object S, and a mixture layer m made of materials of the film M and the object S in the boundary between them. According to this ultraviolet resistant object, existence of the mixture layer m improves an adhesivity of the ultraviolet shielding film M. Accordingly, separation of the film M is suppressed so that deterioration of the resin due to irradiation of the outer surface S1 with ultraviolet light is suppressed for a long term.

FIG. 1(C) shows a cross section of a portion of a resin catheter CT, which is an example of a medical object and has an outer peripheral surface coated with the ultraviolet shielding film M. A mixture layer may be formed in this structure.

In each of the ultraviolet resistant objects of the above examples, the ultraviolet shielding film is formed over the whole outer surface of the film formation object entirely made of resin. However, a film formation object may have a portion made of the polymer material such as resin, and the ultraviolet shielding film may be formed over this polymer material portion.

Figure 2:
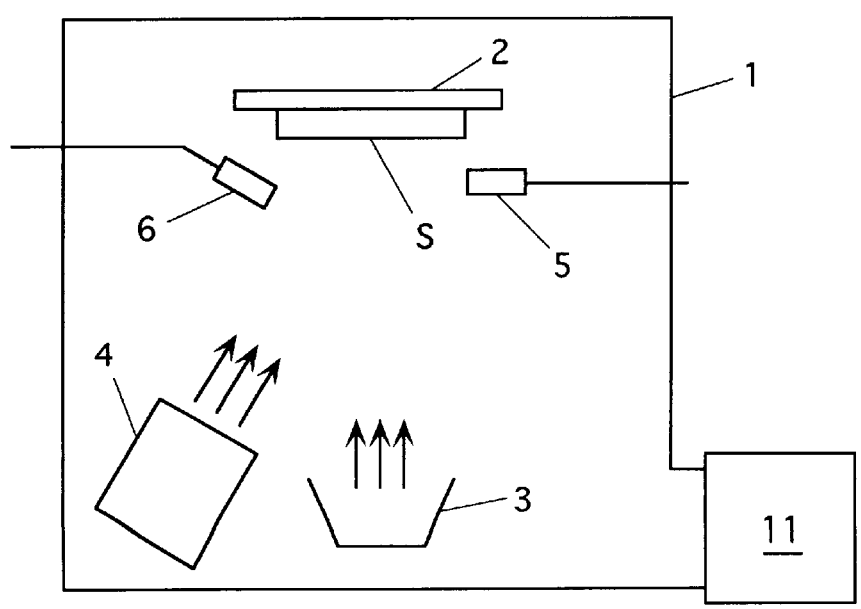
FIG. 2 schematically shows by way of example a structure of a film forming apparatus for implementing a method of the invention.

FIG. 2 shows by way of example a schematic structure of a film forming apparatus which can be used for manufacturing the ultraviolet resistant object. This apparatus has a vacuum container 1 connected to a vacuum exhaust device 11. A holder 2 for holding the film formation object is arranged in the container 1. A vapor source 3 and an ion source 4 are arranged at positions opposed to the holder 2, respectively. A film thickness monitor 5 and an ion current measuring device 6 are arranged near the holder 2.

In the case where ion irradiation and film formation are effected on the whole outer surface of the film formation object or on the film formation object having a complicated structure, the apparatus in FIG. 2 may be provided with a mechanism causing rotation, precession or the like of the holder 2.

For executing the above method (1) by the foregoing apparatus, the film formation object S, e.g., entirely made of resin is transported into the vacuum container 1 by a transporting device (not shown), and is held by the holder 2. Then, the exhaust device 11 starts the operation to attain a predetermined vacuum condition in the container 1, and the film formation surface (i.e., surface to be irradiated with ultraviolet light) of the film formation object S is irradiated with ions of at least one kind of inert gases (mixture of inert gas and oxygen gas may be used if the titanium oxide film or tantalum oxide, e.g., tantalum pentoxide film is to be formed) supplied from the ion source 4 with an irradiation energy from 0.05 keV to 2 keV and an irradiation rate from $1\times10^{13}$ ions/cm$^2$ to $5\times10^{17}$ ions/cm$^2$. Then, a vapor of a predetermined substance depending of the kind of the ultraviolet shielding film is produced from the vapor source 3, and the ultraviolet shielding film is grown to a predetermined thickness on the ion irradiated surface of the object S. Thereby, the ultraviolet resistant object shown in FIG. 1(A) is completed.

According to this method, the ion irradiation is performed prior to the film formation. Therefore, the film formation surface of the film formation object S is activated so that the adhesivity between the ultraviolet shielding film, which will be formed subsequently, and the film formation object S is improved. Therefore, the ultraviolet resistant object can maintain the intended ultraviolet resistance for a long term.

The ultraviolet resistant object in FIG. 1(A) can also be formed by vapor deposition of a predetermined vapor substance on the film formation object without carrying out the ion irradiation.

For executing the above method (2) by the apparatus shown in FIG. 2, processing similar to, e.g., that in the method (1) already described is performed except for the ion irradiation before the film formation is not performed, and the ion irradiation is performed before the thickness of the film formed on the film formation object S exceeds 10 nm. Manners other than the above are similar to those in the method (1). Thereby, the ultraviolet resistant object shown in FIG. 1(B) is completed.

According to this method, the ion irradiation is performed simultaneously with the vapor deposition in the initial stage of film formation. Therefore, a mixture layer is formed in the boundary between the film formation object and the ultraviolet shielding film so that the ultraviolet shielding film has a high adhesivity to the film formation object. Therefore, the produced ultraviolet resistant object can maintain the ultraviolet resistant property for a long term.

The catheter in FIG. 1(C) can be manufactured in a similar manner.

Specific examples of the methods of manufacturing the ultraviolet resistant objects by the apparatus shown in FIG. 2 as well as the manufactured ultraviolet resistant objects will now be described below.

SPECIFIC EXAMPLE 1

An ultraviolet irradiation surface of the film formation object made of PTFE was irradiated with argon (Ar) ions under a pressure of $5\times10^{-5}$ Torr and with an emission energy of 0.5 keV and an irradiation rate of $1\times10^{16}$ ions/cm$^2$, and thereafter vacuum evaporation was performed to grow a film of titanium oxide to a thickness of 500 nm.

SPECIFIC EXAMPLE 2

An ultraviolet irradiation surface of the film formation object made of PCTFE was subjected to vacuum evaporation to grow a film of titanium oxide to a thickness of 500 nm under a pressure of $5\times10^{-5}$ Torr. During this vapor deposition of titanium oxide, the object was irradiated with Ar ions with an emission energy of 0.5 keV and an irradiation rate of $1\times10^{16}$ ions/cm2 before the thickness of the film exceeds 5 nm.

COMPARATIVE EXAMPLE 1

A titanium oxide film of 500 nm in thickness was formed similarly to the above specific example 1 except for that the ion emission energy was 10 keV.

COMPARATIVE EXAMPLE 2

A titanium oxide film was formed similarly to the above specific example 1 except for that the film thickness was 10 μm (10000 nm).

The ultraviolet resistant objects produced in the foregoing specific examples 1 and 2 as well as the comparative examples 1 and 2 were left in a place exposed to light of a usual ultraviolet germicidal lamp for ten days. Also, film formation object (comparative example 3) which was made of PTFE and was not processed was left in the same place for the same term. Before and after the exposure, the surfaces were observed with a scanning electron microscope (SEM), and changes in surface state, which might be caused by the ultraviolet irradiation, were evaluated. A tape-peeling test was carried out on the ultraviolet resistant objects produced by the specific and comparative examples 1 and 2 for evaluating the adhesivity of the films. The results are as follows:

|  | Observed Surface | Tape-Peeling Test |
| --- | --- | --- |
| Specific Example 1 | not changed | not peeled off |
| Specific Example 2 | not changed | not peeled off |
| Com. Example 1 | not changed | peeled off |
| Com. Example 2 | not changed | peeled off |
| Com. Example 3 | roughened |  |

From the above, it can be understood that formation of the titanium oxide film on the outer surface of the film formation object made of the polymer material improves the durability against the ultraviolet light. It can also be understood that, if the ion irradiation for improving the film adhesivity is performed with an excessively high emission energy of 10 keV, the film adhesivity is not improved sufficiently. Further, an excessively large film thickness of 10 μm impairs the film adhesivity.

In the comparative example 3, the irradiation with the ultraviolet light roughened the surface. In connection with this, the composition of the surface portion of the film formation object made of PTFE was determined by an X-ray photoelectron spectroscopy (XPS) before and after the ultraviolet irradiation. It was found that the ultraviolet irradiation reduced the number of fluorine atoms in the surface portion.

Results similar to the above are obtained from the ultraviolet resistant objects, in which film formation objects are made of resin other than PTFE and PCTFE, or a tantalum oxide film is employed instead of the titanium oxide film.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an ultraviolet resistant object, wherein said object has at least a portion made of a polymer material, and is provided with an ultraviolet shielding film made of a substance having in itself an ultraviolet shielding property and covering at least a portion of a surface of said portion made of the polymer material, comprising the steps of:

irradiating the surface of the portion made of the polymer material to be covered with said ultraviolet shielding film with ions with an ion emitting energy in a range from 0.05 keV to 2 keV to attain the total irradiation rate in a range from $1\times10^{13}$ ions/cm$^2$ to $5\times10^{17}$ ions/cm$^2$; and forming the ultraviolet shielding film by vapor deposition over the surface of the portion made of said polymer material and irradiated with the ions after said ion irradiation.

2. A method of manufacturing an ultraviolet resistant object, wherein said object has at least a portion made of a polymer material, and is provided with an ultraviolet shielding film made of a substance having in itself an ultraviolet shielding property and covering at least a portion of a surface of said portion made of the polymer material, comprising the steps of:

forming said ultraviolet shielding film by vapor deposition over said surface of said portion made of the polymer material to be covered with said ultraviolet shielding film; and irradiating, in an initial stage of said film forming step or in a period before film formation, said surface of said portion with ions with an energy in a range from 0.05 keV to 2 keV to attain the total irradiation rate in a range from $1\times10^{13}$ ions/cm$^2$ to $5\times10^{17}$ ions/cm$^2$.

3. The method of manufacturing the ultraviolet resistant object according to claim 2, wherein said ion irradiation is performed before the thickness of said film exceeds 10 nm.

4. The method of manufacturing the ultraviolet resistant object according to claim 1, wherein said ultraviolet shielding film is a film selected from the group consisting of a titanium oxide film and a tantalum oxide film.

5. The method of manufacturing the ultraviolet resistant object according to claim 2, wherein said ultraviolet shielding film is a film selected from the group consisting of a titanium oxide film and a tantalum oxide film.

6. The method of manufacturing the ultraviolet resistant object according to claim 4, wherein said ultraviolet shielding film is formed to have a thickness not exceeding 2000 nm.

7. The method of manufacturing the ultraviolet resistant object according to claim 5, wherein said ultraviolet shielding film is formed to have a thickness not exceeding 2000 nm.

8. The method of manufacturing the ultraviolet resistant object according to claim 1, wherein said polymer material is a resin selected from the group consisting of fluorine-contained resine and silicone resin.

9. The method of manufacturing the ultraviolet resistant object according to claim 2, wherein said polymer material is a resin selected from the group consisting of fluorine-contained resine and silicone resin.

10. The method of manufacturing the ultraviolet resistant object according to claim 4, wherein said polymer material is a resin selected from the group consisting of fluorine-contained resine and silicone resin.

11. The method of manufacturing the ultraviolet resistant object according to claim 5, wherein said polymer material is a resin selected from the group consisting of fluorine-contained resine and silicone resin.

12. The method of manufacturing the ultraviolet resistant object according to claim 1, wherein said ultraviolet resistant object is an object for a medical use.

13. The method of manufacturing the ultraviolet resistant object according to claim 2, wherein said ultraviolet resistant object is an object for a medical use.

14. The method of manufacturing the ultraviolet resistant object according to claim 10, wherein said ultraviolet resistant object is an object for a medical use.

15. The method of manufacturing the ultraviolet resistant object according to claim 11, wherein said ultraviolet resistant object is an object for a medical use.

16. The method of manufacturing the ultraviolet resistant object according to claim 1, wherein said ultraviolet shielding film is formed by a film forming method selected from the group consisting of a vacuum evaporation method, a sputtering method, an ion plating method and a CVD method.

17. The method of manufacturing the ultraviolet resistant object according to claim 2, wherein said ultraviolet shielding film is formed by a film forming method selected from the group consisting of a vacuum evaporation method, a sputtering method, an ion plating method and a CVD method.

18. The method of manufacturing the ultraviolet resistant object according to claim 4, wherein prior to formation of said tantalum oxide film or said titanium oxide film, a tantalum film for said tantalum oxide film or a titanium film for said titanium oxide film is formed as an intermediate film, and said tantalum oxide film or said titanium oxide film is formed on said intermediate film.

19. The method of manufacturing the ultraviolet resistant object according to claim 5, wherein prior to formation of said tantalum oxide film or said titanium oxide film, a tantalum film for said tantalum oxide film or a titanium film for said titanium oxide film is formed as an intermediate film, and said tantalum oxide film or said titanium oxide film is formed on said intermediate film.

* * * * *